United States Patent [19]

Donovan et al.

[11] Patent Number: 5,229,171
[45] Date of Patent: Jul. 20, 1993

[54] APPARATUS AND METHOD FOR UNIFORMLY COATING A SUBSTRATE IN AN EVACUABLE CHAMBER

[75] Inventors: Robert P. Donovan, Durham; Ravindran Periasamy, Cary; Anthony C. Clayton, Rougemont; David S. Ensor, Chapel Hill, all of N.C.

[73] Assignee: Research Triangle Institute, Research Triangle Park, N.C.

[21] Appl. No.: 813,121

[22] Filed: Dec. 23, 1991

[51] Int. Cl.⁵ .................................................. B05D 1/04
[52] U.S. Cl. ...................................... 427/483; 118/50.1; 118/627; 118/629; 239/3; 239/4; 239/102.2; 239/690; 427/485; 427/510; 430/935
[58] Field of Search ................. 427/14.1, 27, 30, 43.1, 427/475, 483, 485, 510; 118/50.1, 621, 624, 625, 627, 629; 239/4, 102.2, 690, 708, 3; 430/935

[56] References Cited

U.S. PATENT DOCUMENTS

| | | | |
|---|---|---|---|
| 2,773,472 | 12/1956 | Lamm | 118/624 |
| 3,680,779 | 8/1972 | Reilly | 239/708 |
| 3,714,928 | 2/1973 | Taylor | 118/624 |
| 4,011,991 | 3/1977 | Masuda | 239/708 |
| 4,290,384 | 9/1981 | Ausschnitt et al. | 118/722 |
| 4,465,704 | 8/1984 | McCormick-Goodhart et al. | 427/1 |
| 4,645,895 | 2/1987 | Boxman et al. | 118/623 |
| 4,826,703 | 5/1989 | Kisler | 427/14.1 |
| 4,924,803 | 5/1990 | Celant | 118/326 |
| 4,989,541 | 2/1991 | Mikoshiba et al. | 118/723 |

FOREIGN PATENT DOCUMENTS

| | | | |
|---|---|---|---|
| 205557 | 8/1956 | Australia | 427/27 |
| 2734174 | 2/1979 | Fed. Rep. of Germany | 427/483 |
| 1163104 | 9/1958 | France | 427/30 |
| 750299 | 6/1956 | United Kingdom . | |

OTHER PUBLICATIONS

Hochberg, Hoekstra, & Pennignton, *Depositing Photoresist in Thin Layers Independent of Surface Area*, IBM Technical Disclosure Bulletin, vol. 19, No. 6, pp. 2239-2240, Nov. 1976.

Periasamy, Clayton, Donovan & Ensor, *Generation of Uniformly Sized, Charged Particles in Vaccum*, Aerosol Science and Technology, vol. 15/#3, (21 pages), (Oct. 1991).

*Primary Examiner*—Terry J. Owens
*Attorney, Agent, or Firm*—Bell, Seltzer, Park & Gibson

[57] ABSTRACT

An apparatus and method including a droplet coating generator for generating a stream of electrically charged coating droplets within an evacuable chamber towards a substrate positioned within the evacuable chamber. A piezoelectric vibrator and orifice plate coupled thereto generate the stream of coating droplets. The coating droplets are urged to move in a sweeping motion across the substrate by at least one pair of opposing spaced apart electrodes powered by an electrical power supply. A uniform coating is thus produced while the evacuable chamber is maintained at subatmospheric pressure as required during typical semiconductor processing. Multiple applications of a photoresist coating may be applied by the coating apparatus without requiring that the evacuable chamber be repeatedly vented and pumped down to subatmospheric pressure.

37 Claims, 2 Drawing Sheets

APPARATUS AND METHOD FOR UNIFORMLY COATING A SUBSTRATE IN AN EVACUABLE CHAMBER

FIELD OF THE INVENTION

The present invention relates to the field of semiconductor processing and, more particularly, to an apparatus and method for uniformly coating a substrate maintained at subatmospheric pressure in an evacuable chamber.

BACKGROUND OF THE INVENTION

During the fabrication of microelectronic circuits, a semiconductor substrate is typically coated at least once with photoresist or other masking material. Generally, photoresist is applied to completely cover the surface of the substrate. The photoresist layer is then exposed to ultraviolet light, or other radiation, through a mask containing the circuit patterns to be formed. Depending on the type of photoresist employed, either the exposed or non-exposed portions of the photoresist are then removed. Conventional etching or deposition steps may then be performed on the substrate. Thus, the photoresist protects the underlying portions of the substrate during microelectronic circuit fabrication.

For large scale integration, it is important that a uniform and defect-free photoresist be deposited. The most common technique for applying photoresist to a substrate is to place a drop of photoresist on the center of the substrate and then rotate the substrate to spread the photoresist over the substrate. Other alternatives to this spin-on technique have also been developed. For example, an article by Hochberg, Hoekstra, and Pennington entitled *Depositing Photoresist in Thin Layers Independent of Surface Area*, IBM Technical Disclosure Bulletin, Vol. 19, No. 6, pp. 2239-2240, Nov., 1976 describes an apparatus for uniformly depositing a photoresist mist onto the surface of a substrate or other object at atmospheric pressure. In particular, the apparatus includes an ultrasonic nebulizer to form the mist, and the substrate itself is statically charged to a polarity opposite that of the mist particles to thereby attract the mist particles to the substrate surface.

U.S. Pat. No. 4,290,384 to Ausschnitt et al. discloses a method and apparatus for coating a substrate with a mist of photoresist formed in a first chamber and transported to a deposition chamber by a carrier gas. Once in the deposition chamber, the photoresist mist settles onto the substrate under the force of gravity and under the influence of a sonic transducer to increase the settling rate of the mist. U.S. Pat. No. 4,989,541 to Mikoshiba et al. also describes a vertically oriented apparatus wherein discharged particles impact the surface to be coated under the influence of gravity and a control gas flow. The control gas forms a sheath around the particles and prevents the particles from impacting the walls of the reactor chamber and from being influenced by any heat convection turbulence.

For most semiconductor processing, each of several photoresist applications is followed by a conventional semiconductor processing step, such as etching, deposition, sputtering or plasma oxidation. The semiconductor processing steps typically require that the substrate be placed in an evacuable chamber and that the chamber be pumped down to subatmospheric pressure. Unfortunately, conventional spin-on techniques and the other techniques described above for applying photoresist or other coatings require that the substrate be vented and brought back to atmospheric pressure after a vacuum processing step has been performed. Moreover, repeated vacuum processing steps require that the evacuable chamber be repeatedly vented and then pumped down for each subsequent processing operation.

When a chamber is repeatedly pumped down and vented, particles may be formed and re-entrained in the chamber to eventually deposit on the substrate. Such particle contamination during vacuum processing may create defects in submicrometer semiconductor devices. The repeated venting and evacuation steps also greatly slow and reduce the production efficiency of the fabrication process. In addition, good uniformity of the photoresist coating on the substrate is important because induced striations and other nonuniformities may result in unreliable photoresist development which lead to unreliable or failed circuit elements in the finished microcircuit.

SUMMARY OF THE INVENTION

It is therefore an object of the present invention to provide an apparatus and method for applying a coating in an evacuable chamber while the chamber is maintained at a subatmospheric pressure.

It is another object of the present invention to provide an apparatus and method for applying a uniform coating on a substrate in an evacuable chamber.

These and other objects and advantages of the present invention are provided by an apparatus for depositing a coating onto a substrate including a coating droplet generator communicating with an evacuable chamber for generating a stream of electrically charged coating droplets towards a substrate positioned on a substrate holder while the chamber is maintained at a subatmospheric pressure. At least one pair of electrodes is positioned in opposing spaced apart relation around the stream of electrically charged coating droplets and preferably adjacent opposite ends of the substrate holder. The electrodes are powered by an electrical power supply for causing the stream of electrically charged coating droplets to uniformly cover the substrate.

The coating droplet generator is preferably positioned in opposing spaced apart vertical relation above the substrate holder. The coating droplet generator includes a piezoelectric vibrator and an orifice plate coupled thereto for generating the stream of electrically charged coating droplets. The piezoelectric vibrator is powered by a signal of preferably about 200 KHz. An electrical charge is typically inherently imparted to the stream of coating droplets by the physical process of forming the droplets. However, an electrically powered ring electrode may be positioned adjacent the orifice plate to more precisely control the electrical charge on the stream of droplets.

The electrical power supply for the at least one pair of electrodes includes conventional means for powering the pair of electrodes at a predetermined voltage and at a predetermined frequency so that the electrically charged coating droplets are urged to move in a sweeping motion across the substrate. Good uniformity of the coating on the substrate is thereby achieved.

The coating droplet generator may be connected to the evacuable chamber by a tubular alignment bellows and a collimating tube. The alignment bellows permits adjustment of the trajectory of the stream of coating droplets so that they are directed to the substrate.

The at least one pair of electrodes are preferably positioned outside the evacuable chamber to reduce contamination thereon caused by contact with the coating droplets. In a preferred embodiment of the invention, a first and a second pair of opposing spaced apart electrodes are positioned surrounding the stream of electrically charged coating droplets and adjacent the substrate holder. In this embodiment, the electrical power supply includes means for powering each of the first and second pairs of opposing electrodes with a predetermined voltage and at a predetermined frequency so that the electrically charged coating droplets are urged to move in a sweeping motion across the substrate between the respective electrodes of each pair of electrodes. Preferably, the first and second pairs of electrodes are powered at different frequencies, such as about 1.5 Hz and less than about 1.5 Hz, respectively.

The method according to the invention includes the steps of generating a stream of electrically charged coating droplets towards the substrate positioned within the evacuable chamber while maintaining the evacuable chamber at a subatmospheric pressure, and urging the electrically charged coating droplets from the stream of coating droplets to move in a sweeping motion across the substrate to uniformly cover the substrate.

When a photoresist coating is used, the photoresist coating can be applied while the substrate is maintained at subatmospheric pressure. Then the photoresist coating can be selectively exposed to radiation, such as UV light, to form a desired pattern thereon. Thus, repeated etching or deposition process steps may be performed on the substrate while the evacuable chamber is maintained at a subatmospheric pressure. Being able to apply the photoresist at subatmospheric pressure obviates the need for repeated venting and pumping down of the pressure within the evacuable chamber.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiment set forth herein. Rather, applicants provide this embodiment so that this disclosure will be thorough and complete, and will fully convey the scope of the invention to those skilled in the art. Like numbers refer to like elements throughout.

Figure 1:
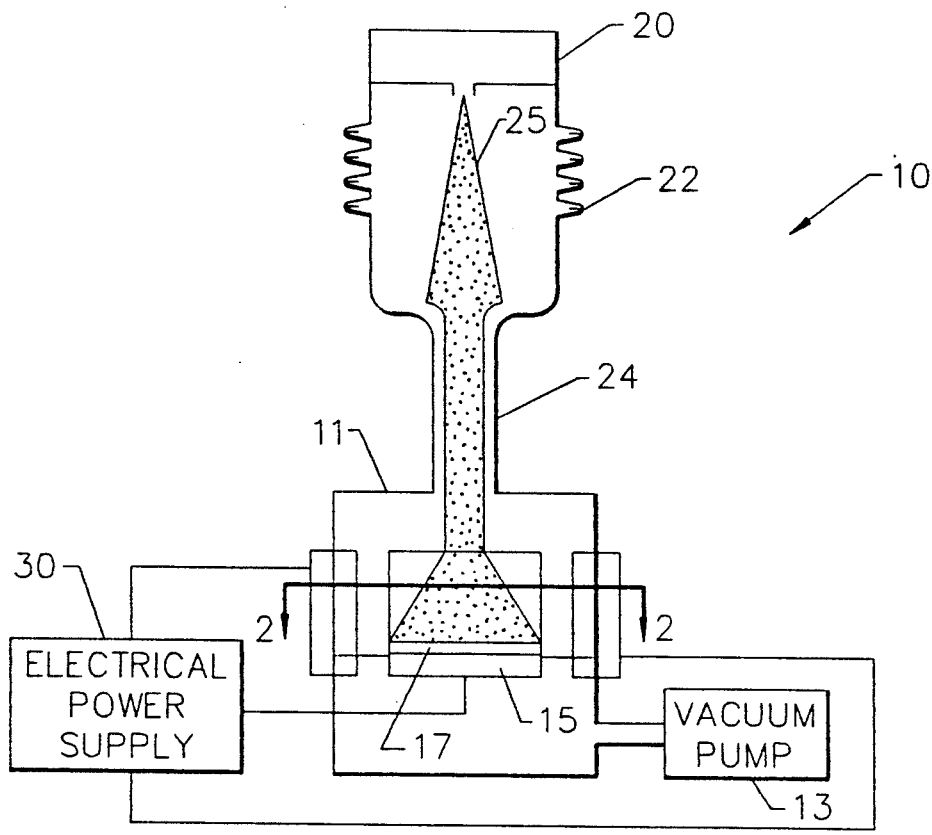
FIG. 1 is a schematic cross-sectional view of the coating apparatus according to the invention.
Figure 2:
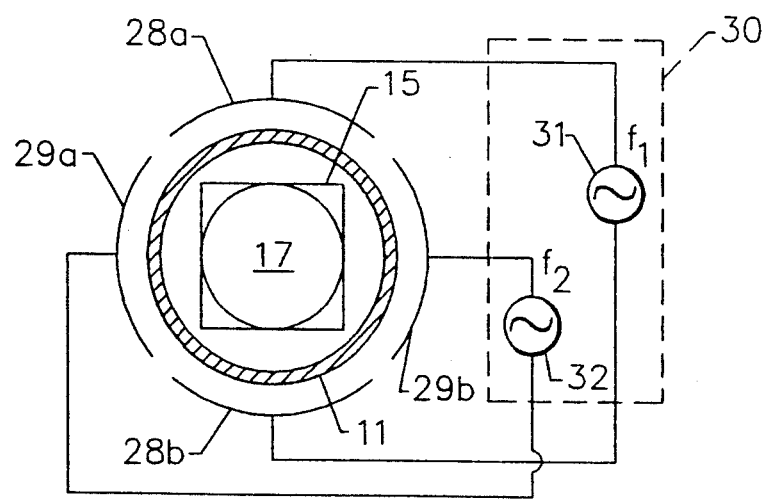
FIG. 2 is cross-sectional view of the coating apparatus as shown along lines 2—2 in FIG. 1.

The coating apparatus according to the present invention, as shown in FIGS. 1 and 2, is generally designated by reference numeral 10. Referring to FIG. 1, the coating apparatus 10 includes an evacuable chamber 11, such as may typically be used for conventional processing of semiconductor substrates. A vacuum pump 13 is connected to the evacuable chamber 11 to pump the evacuable chamber down to a subatmospheric pressure for applying a coating, as well as subsequent semiconductor processing steps.

A substrate holder 15 is positioned within the evacuable chamber 11 and the substrate 17 to be coated is placed onto the substrate holder. A coating droplet generator 20 is coupled to the evacuable chamber 11 by an alignment bellows 22 and a collimating tube 24. Thus, the coating droplet generator 20 communicates with the evacuable chamber 11 and provides a stream of Coating droplets 25 directed towards a substrate 17 positioned on the substrate holder 15. As described more fully below, the coating droplet generator 20 produces an electrical charge on the stream of coating droplets 25 produced therefrom.

The alignment bellows 22 permits adjustment of the relationship of the coating droplet generator 20 with respect to the substrate 17 and the collimating tube 24. The alignment bellows 22 is preferably a conventional stainless steel bellows with adjustable screws to connect to the collimating tube 24. By turning the adjusting screws of the alignment bellows 22, the coating droplet generator 20 may be tilted and the trajectory of the coating droplet stream 25 aligned to prevent the coating droplets from impacting on the inner walls of the collimating tube 24.

The collimating tube 24 may have a typical diameter of about 2 inches, but may be varied as would be readily understood by those skilled in the art to accommodate different sized substrates 17. The length of the collimating tube 24 may also be varied, as would be readily understood by those skilled in the art, depending on a desired drying time needed for the evaporation of a solvent from the coating droplets. Drying may also be enhanced by forming the collimating tube 24 from a transparent material, such as quartz, and positioning one or more high intensity infrared lamps, not shown, surrounding the quartz tube to heat the stream of coating droplets 25.

Referring to FIG. 2, a first pair of opposing spaced apart electrodes 28a, 28b and a second pair of opposing spaced apart electrodes 29a, 29b are positioned surrounding the stream of coating droplets 25 and preferably adjacent opposing ends of the substrate holder 17. The pairs of electrodes are connected to an electrical power supply 30 that provides a predetermined voltage and frequency to each pair to cover the substrate 17 with a uniform coating. The thus powered pairs of electrodes urge the electrically charged coating droplets from the stream of droplets 25 to move in a sweeping motion across the substrate 17 to ensure uniform coating of the substrate.

As shown schematically in FIG. 2, the first pair of electrodes 28a, 28b is connected to a first source 31 which powers the electrodes at a first frequency $f_1$. Similarly, the second pair of electrodes 29a, 29b is powered at a second frequency $f_2$. It has been found, according to the invention, that greater uniformity of coating results when the first frequency $f_1$ is different from the second frequency $f_2$. For example, preliminary testing indicates that the first frequency f' is preferably less than about 1.5 Hz, while the second frequency $f_2$ is about 1.5 Hz. It is also preferred that the first frequency $f_1$ not be an integer multiple of the second frequency $f_2$. The stream of electrically charged coating droplets 25 is influenced by the two different time-varying electric fields produced in the area between the pairs of electrodes to uniformly coat the substrate 17.

A voltage of about 400 volts, applied to each pair of electrodes 28a, 28b; 29a, 29b, was also found to produce good uniformity of the coating. As would be readily understood by those having skill in the art, the voltage and frequency supplied to the pairs of electrodes may readily be determined and fine-tuned by empirical testing. In addition, the pairs of electrodes may be positioned within the chamber 11 rather than outside of the chamber as shown in FIGS. 1 and 2. Positioning the pairs of electrodes 28a, 28b; 29a, 29b outside of the chamber 11 has the advantage of preventing any contaminating accumulation of coating droplets on the electrodes. However, positioning the pairs of electrodes within the chamber 11 may permit the electrodes to be powered at a lower voltage to achieve the same strength electrical field while also achieving good coating uniformity. As would be readily understood by those skilled in the art, at least one pair of opposing spaced apart electrodes may produce sufficient uniformity of the coating on the substrate, and more than two pairs of electrodes may also be advantageously used in the coating apparatus 10 according to the invention.

Figure 3:
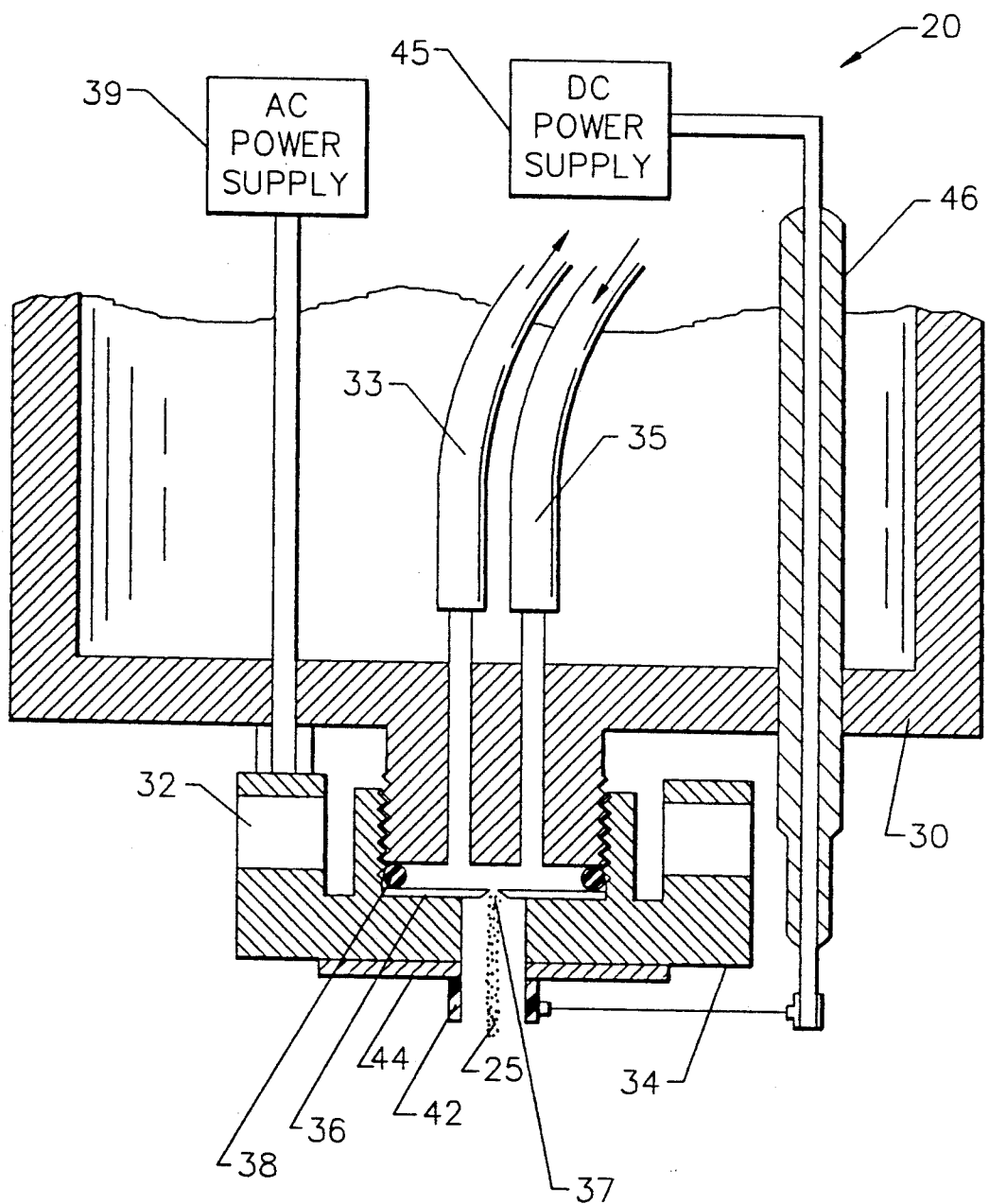
FIG. 3 is a greatly enlarged schematic cross-sectional view of a portion of the coating droplet generator according to the present invention.

Referring to FIG. 3, a portion of the coating droplet generator 20 according to the invention is shown schematically in cross-section. The coating droplet generator 20 produces a continuous stream of monodisperse and electrically charged droplets in subatmospheric pressures. The coating droplet generator 20 may be constructed by modifying a conventional vibrating orifice aerosol generator (VOAG). A conventional VOAG has been shown to be a useful and dependable device for generating uniform sized liquid and solid particles in atmospheric pressure, but has no control over the particle charge other than charge neutralization with a radioactive source.

The coating droplet generator 3D includes a housing 30 with a piezoelectric crystal vibrator 32 secured to a mounting bracket 34 threaded onto a portion of the housing 30, as in a conventional VOAG. The piezoelectric vibrator 32 is mechanically coupled to an orifice plate 36 having an opening 37 therein of a predetermined diameter. The vibration of the orifice plate 36 causes a liquid stream supplied by a liquid feed line 35 to break into fine droplets. A liquid outlet line 33 may also be provided for cleaning or flushing out the coating droplet generator 20.

As shown in FIG. 3, the orifice plate 36 may be positioned between the generator housing 30 and the mounting bracket 34 in conjunction with a sealing O-ring 38. The piezoelectric vibrator 32 is driven by a conventional alternating current power supply 39 of a predetermined frequency, preferably about 200 KHz.

The number of droplets generated per unit of time by the coating droplet generator 20 is equal to the oscillation frequency of the piezoelectric vibrator 32. Thus, the number of coating droplets may be controlled by adjusting the frequency of the AC signal driving the piezoelectric vibrator 32. In addition, generated coating droplet size may be controlled by altering the diameter of the opening 37 of the orifice plate 36. The opening 37 in the orifice plate 36 may preferably be in the range of about 10 μm to 20 μm in diameter. Alternately, different concentrations of the coating material in a volatile solvent may be used to generate various uniform sized droplets using the same opening 37 in an orifice plate 36.

The coating liquid feed system supplying the coating droplet generator 20 through the liquid feed line 35 consists of a conventional syringe driven by a motor, not shown, as would be readily understood by those skilled in the art. The conventional syringe and motor supply a constant flow rate through the opening 37 of the orifice plate 36, thus producing a steady coating droplet stream 25 (FIG. 1) from the coating droplet generator 20. The pressure differential within the evacuable chamber 11 further assist in dispersing the emerging coating droplets from the orifice plate 36, thereby permitting evaporation of any solvents included in the liquid coating mixture.

Referring to FIG. 3, unlike a conventional VOAG which has no means to control the charge of droplets generated, the coating droplet generator 20 according to the present invention preferably includes an electrically conductive ring, or ring electrode 42, positioned on an insulator 44 adjacent the mounting bracket 34. The ring electrode 42 may be formed of stainless steel and the insulator 44 may be MYLAR. A conventional VOAG may be modified to permit connection to the DC power supply 45 by converting the dispersion air line in the conventional VOAG to an electrical feedthrough 46 for the DC power supply. The ring electrode 42 is thus fed by a controllable DC power supply 45 to induce a desired electrical charge, of either polarity, to the uniformly sized coating droplets emerging from the opening 37 in the orifice plate 36.

While it has been shown that the spraying process in a conventional VOAG itself imparts an electrical charge on the droplets by the mechanical disruption of the liquid jet in the VOAG, the coating droplet generator 20 according to the present invention preferably includes the ring electrode 42 and DC power supply 45 associated therewith to more accurately control the electrical charge on the coating droplets.

The total charge on a coating droplet generated depends upon the field set up by the ring electrode 42. The total charge acquired by the droplet due to the spraying and induction charging of the sprayed coating liquid can be described by the following equation:

$$q_t = q_s + q_i \tag{1}$$

where $q_t$ is the total charge on the droplet produced by the coating droplet generator 20, $q_s$ is the charge due the spraying process alone, and $q_i$ is the charge imparted on the droplet from the induction charging by the ring electrode 42.

For a liquid stream issuing from a reservoir and traveling through a concentric ring electrode 42, $q_1$ is given by:

$$q_i = \frac{8\pi V \epsilon r^3}{3a^2 \ln \frac{b}{a}} \tag{2}$$

Here, V is the applied voltage, $\epsilon$ is the gas permittivity, r is the radius of the drops formed from the stream, a is the radius of the stream, and b is the inner radius of the ring electrode 42. As would be readily understood by those skilled in the art, the maximum voltage that may be applied to the ring electrode is limited by the breakdown voltage of the gas in the evacuable chamber 11.

Controlling the charge on the coating droplets effects the dispersion of the droplets in the stream of droplets 25 due to the electrostatic repulsion of like-charged droplets. In addition, the electrical charge on the droplets effects the degree to which the droplets are swept across the substrate 17 under the influence of the time-varying electric fields produced by the pairs of electrodes 28a, 28b; 29a, 29b. It has been found that a charge of about one thousand units of charge per droplet ($1.6 \times 10^{-16}$ Coulombs) may be readily achieved and advantageously imparted to the coating droplets according to the invention.

An estimate of the coating droplet size, Dp, can also be obtained from the liquid feed rate, Q, and the volumetric concentration of nonvolatile in a volatile solvent, C, using the following equation:

$$D_p = \left[ \frac{6QC}{\pi f} \right]^{\frac{1}{3}} \quad (3)$$

where f is the frequency of the AC signal applied to the piezoelectric vibrator 32 of the coating droplet generator 20. Accordingly, the coating droplet generator 20 of the present invention also permits the generation, in subatmospheric pressures, of coating droplets of a desired size, concentration, and electrical charge.

As best understood with reference to FIG. 1, the method according to the invention includes the steps of generating a stream of electrically charged coating droplets 25 towards the substrate 17 positioned within the evacuable chamber 11 while maintaining the evacuable chamber at a subatmospheric pressure, and urging the electrically charged coating droplets from the stream of coating droplets to move in a sweeping motion across the substrate to uniformly cover the substrate. As described above, at least one pair of opposing spaced apart electrodes is connected to an electrical power source to urge the charged coating droplets to move across the substrate 17 to uniformly cover the substrate.

Another significant feature of the method according to the present invention is that a photoresist coating in particular may be applied while the substrate is maintained at subatmospheric pressure. Then the photoresist coating can be selectively exposed to radiation, such as UV light, through an appropriate mask, to form a desired pattern thereon. Thus, an etching, deposition, or other semiconductor processing step may be performed on the substrate while the evacuable chamber 11 is maintained at a subatmospheric pressure. Repeated photoresist and processing steps may be performed while the substrate 17 remains at subatmospheric pressure, thereby obviating the need for repeated venting and pumping down of the pressure within the evacuable chamber 11.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. An apparatus for depositing a coating onto a substrate, said apparatus comprising:
   an evacuable chamber;
   a substrate holder positioned within said evacuable chamber;
   a coating droplet generator communicating with said evacuable chamber for generating a stream of electrically charged coating droplets towards a substrate positioned on said substrate holder with said evacuable chamber maintained at a subatmospheric pressure;
   at least one pair of electrodes positioned in opposing spaced apart relation around the stream of electrically charged coating droplets; and
   an electrical power supply connected to said at least one pair of electrodes for applying a time varying electric field to the stream of electrically charged coating droplets and causing the stream of electrically charged coating droplets to sweep across the substrate and uniformly cover the substrate.

2. The coating apparatus according to claim 1 wherein said coating droplet generator is positioned in opposing spaced apart vertical relation above said substrate holder.

3. The coating apparatus according to claim 1 wherein said coating droplet generator includes means for controlling the electrical charge on the stream of electrically charged coating droplets.

4. The coating apparatus according to claim 1 wherein said coating droplet generator comprises a piezoelectric vibrator and an orifice plate coupled thereto for generating the stream of electrically charged coating droplets.

5. The coating apparatus according to claim 4 further comprising a second alternating current electrical power supply connected to said piezoelectric vibrator.

6. The coating apparatus according to claim 1 wherein said electrical power supply is an alternating current electrical power supply for powering said at least one pair of electrodes at an alternating current frequency.

7. The coating apparatus according to claim 6 wherein said at least one pair of opposing spaced apart electrodes are positioned adjacent opposite ends of said substrate holder.

8. The coating apparatus according to claim 7 wherein said at least one pair of electrodes is positioned outside said evacuable chamber.

9. The coating apparatus according to claim 1 further comprising a tubular alignment bellows and a collimating tube each having first and second opposing open ends, wherein the first open end of said tubular alignment bellows is connected to said coating droplet generator, wherein the second open end of said tubular alignment bellows is connected to the first open end of said collimating tube, and wherein the second open end of said collimating tube is in communication with said evacuable chamber.

10. An apparatus for uniformly depositing a coating onto a substrate, said apparatus comprising:
   an evacuable chamber;
   a substrate holder positioned within said evacuable chamber;
   a coating droplet generator communicating with said evacuable chamber, said coating droplet generator comprising a piezoelectric vibrator and an orifice plate coupled thereto for generating a stream of electrically charged coating droplets towards a substrate positioned on said substrate holder;
   a first pair and a second pair of opposing spaced apart electrodes positioned surrounding the stream of electrically charged coating droplets; and
   an electrically power supply connected to each of said first and second pairs of opposing spaced apart electrodes for applying a time varying electric field to the stream of electrically charged coating droplets and causing the stream of electrically charged coating droplets to sweep across the substrate and uniformly cover the substrate.

11. The coating apparatus according to claim 10 wherein said coating droplet generator is positioned in opposing spaced apart vertical relation above said substrate holder.

12. The coating apparatus according to claim 10 wherein said coating droplet generator further comprises a ring electrode positioned adjacent said orifice plate and adapted to be connected to a second electrical power supply for controlling the electrical charge on the coating droplets.

13. The coating apparatus according to claim 12 further comprising a third alternating current electrical power supply connected to said piezoelectric vibrator.

14. The coating apparatus according to claim 10 wherein said electrical power supply is an alternating current electrical power supply for powering each of said first and second pairs of opposing electrodes at an alternating current frequency.

15. The coating apparatus according to claim 14 wherein said alternating current electrical power supply includes means for powering said first pair of electrodes at an alternating current frequency different from said second pair of electrodes.

16. The coating apparatus according to claim 15 wherein said alternating current electrical power supply includes means for powering said first pair of electrodes at a frequency of about 1.5 Hertz and said second pair of electrodes at a frequency of not more than about 1.5 Hertz.

17. The coating apparatus according to claim 14 wherein said at least one pair of opposing spaced apart electrodes are positioned adjacent opposite ends of said substrate holder.

18. The coating apparatus according to claim 17 wherein said first and second pairs of electrodes are positioned outside said evacuable chamber.

19. The coating apparatus according to claim 10 further comprising a tubular alignment bellows and a collimating tube each having first and second opposing open ends, wherein the first open end of said tubular alignment bellows is connected to said coating droplet generator, wherein the second open end of said tubular alignment bellows is connected to the first open end of said collimating tube, and wherein the second open end of said collimating tube is in communication with said evacuable chamber.

20. An apparatus for depositing a coating onto a substrate within an evacuable chamber, the evacuable chamber including a substrate holder positioned therein, said apparatus comprising:
a coating droplet generator adapted to be coupled in communication with the evacuable chamber for generating a stream of electrically charged coating droplets, such that the stream of electrically charged coating droplets is directed towards a substrate positioned on the substrate holder with the evacuable chamber maintained at a subatmospheric pressure, when said coating droplet generator is coupled to the evacuable chamber;
at least one pair of electrodes adapted to be positioned in opposing spaced apart relation around the stream of electrically charged coating droplets; and
an electrical power supply connected to said at least one pair of electrodes for applying a time varying electric field to the stream of electrically charged coating droplets and causing the stream of electrically charged coating droplets to sweep across the substrate and uniformly cover the substrate, when said at least one pair of electrodes is positioned in opposing spaced apart relation around the stream of electrically charged coating droplets.

21. The apparatus according t claim 20 wherein said coating droplet generator comprises a piezoelectric vibrator and an orifice plate coupled thereto for generating the stream of electrically charged coating droplets.

22. The apparatus according to claim 21 wherein said coating droplet generator further comprises a ring electrode positioned adjacent said orifice plate for connection to a second electrical power supply for controlling the electrical charge on the coating droplets.

23. The apparatus according to claim 22 further comprising a third alternating current electrical power supply connected to said piezoelectric vibrator.

24. The apparatus according to claim 20 wherein said electrical power supply is an alternating current electrical power supply for powering said at least one pair of electrodes at an alternating current frequency.

25. A method for depositing a coating onto a substrate positioned within an evacuable chamber, said method comprising the steps of:
generating a stream of electrically charged coating droplets towards the substrate positioned within the evacuable chamber while maintaining the evacuable chamber at subatmospheric pressure; and
applying a time varying electrical field to the stream of electrically charged coating droplets to thereby sweep the electrically charged coating droplets across the substrate and uniformly cover the substrate.

26. The method according to claim 25 wherein the step of generating a stream of electrically charged coating droplets towards the substrate comprises the step of generating the stream of coating droplets in a downward vertical direction to the substrate.

27. The method according to claim 25 further comprises the step of controlling the electrical charge on the electrically charged coating droplets.

28. The method according to claim 25 wherein the applying step comprises the step of electrically powering at least one pair of opposing spaced apart electrodes around the stream of coating droplets at an alternating current frequency.

29. The method according to claim 25 wherein the applying step comprises the step of electrically powering a first pair and a second pair of opposing spaced apart electrodes surrounding the stream of coating droplets at an alternating current frequency.

30. The method according to claim 29 wherein the step of electrically powering the first pair and second pair of opposing spaced apart electrodes comprises powering the first pair of electrodes at a different frequency than the second pair of electrodes.

31. A method for processing a substrate positioned within an evacuable chamber, said method comprising the steps of:
generating a stream of electrically charged photoresist coating droplets towards a substrate positioned within the evacuable chamber while maintaining the evacuable chamber at subatmospheric pressure;
applying a time varying electric field to the stream of electrically charged photoresist droplets to thereby sweep the electrically charged photoresist coating droplets across the substrate to uniformly cover the substrate with photoresist; and selectively exposing the photoresist coating on the substrate to radiation to form a pattern on the substrate.

32. The method according to claim 31 further comprising the step of processing the substrate with the photoresist pattern formed on the substrate while the evacuable chamber is maintained at subatmospheric pressure.

33. The method according to claim 31 wherein the step of generating a stream of electrically charged photoresist coating droplets towards the substrate comprises the step of generating the stream of coating droplets in a downward vertical direction to the substrate.

34. The method according to claim 31 further comprising the step of controlling the electrical charge on the electrically charged photoresist coating droplets.

35. The method according to claim 31 wherein the step of urging the electrically charged photoresist coating droplets to move in a sweeping motion across the substrate comprises the step of electrically powering at least one pair of opposing spaced apart electrodes around the stream of photoresist coating droplets at an alternating current frequency.

36. The method according to claim 31 wherein the step of urging the electrically charged photoresist coating droplets to move in a sweeping motion across the substrate comprises the step of electrically powering a first pair and a second pair of opposing spaced apart electrodes surrounding the stream of photoresist coating droplets with alternating current.

37. The method according to claim 36 wherein the step of electrically powering the first pair and second pair of opposing spaced apart electrodes. comprises powering the first pair of electrodes at a different frequency than the second pair of electrodes.

* * * * *

UNITED STATES PATENT AND TRADEMARK OFFICE
CERTIFICATE OF CORRECTION

PATENT NO. : 5,229,171
DATED : Donovan et al.
INVENTOR(S) : July 20, 1993

It is certified that error appears in the above-indentified patent and that said Letters Patent is hereby corrected as shown below:

Column 4, line 11, "Coating" should be --coating--.

Column 4, line 61, "f'" should be --$f_1$--.

Column 5, line 36, "3D" should be --30--.

Column 6, line 49, "$q_1$" should be --$q_i$--.

Column 8, line 65, "electrically" should be --electrical--.

Column 10, line 7, "t" should be --to--.

Column 10, lines 41-42, "comprises" should be --comprising--.

Column 12, line 17, after "electrodes" delete --.--.

Signed and Sealed this

Twenty-ninth Day of March, 1994

Attest:

BRUCE LEHMAN

*Attesting Officer*      *Commissioner of Patents and Trademarks*